United States Patent
Braun et al.

(10) Patent No.: US 6,434,039 B1
(45) Date of Patent: Aug. 13, 2002

(54) CIRCUIT CONFIGURATION FOR READING A MEMORY CELL HAVING A FERROELECTRIC CAPACITOR

(75) Inventors: Georg Braun, München (DE); Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/838,750

(22) Filed: Apr. 19, 2001

(30) Foreign Application Priority Data

Apr. 19, 2000 (DE) ............................... 100 19 481

(51) Int. Cl.⁷ ............................................... G11C 11/22
(52) U.S. Cl. ........................................ 365/145; 365/208
(58) Field of Search ................................. 365/145, 205, 365/207, 208, 210

(56) References Cited

U.S. PATENT DOCUMENTS

| | | | |
|---|---|---|---|
| 5,274,583 A | 12/1993 | Rapp | 364/829 |
| 5,905,671 A | 5/1999 | DeVilbiss | 365/145 |
| 5,969,980 A | 10/1999 | Allen et al. | 365/145 |
| 5,986,919 A | 11/1999 | Allen et al. | 365/145 |
| 5,991,188 A | 11/1999 | Chung et al. | 365/145 |
| 5,999,439 A | 12/1999 | Seyyedy | 365/145 |
| 6,002,634 A | 12/1999 | Wilson | 365/230.06 |
| 6,141,237 A * | 10/2000 | Eliason et al. | 365/145 |
| 6,215,692 B1 * | 4/2001 | Kang | 365/145 |

OTHER PUBLICATIONS

Hiroki Jujisawa et al.: "The Charge–Share Modified (CSM) Precharge–Level Architecture for High–Speed and Low–Power Ferroelectric Memory", IEEE Journal of SolidState Circuits, vol. 32, No. 5, May 1997, pp. 655–661.

* cited by examiner

Primary Examiner—Son Luu Mai
(74) Attorney, Agent, or Firm—Laurence A. Greenberg; Werner H. Stemer; Gregory L. Mayback

(57) ABSTRACT

A circuit configuration for reading a ferroelectric memory cell which has a ferroelectric capacitor is described. The memory cell is connected to a bit line. The circuit configuration provides a differential amplifier having a first differential amplifier input, a second differential amplifier input and a differential amplifier output. The first differential amplifier input is connected to the bit line, and the second differential amplifier input is connected to a reference signal. A first driver input of a first driver circuit is connected to the differential amplifier output, and a first driver output is connected to the bit line. The differential amplifier is fed back through the first driver circuit and regulates the bit line voltage to the voltage value of the reference signal.

6 Claims, 1 Drawing Sheet

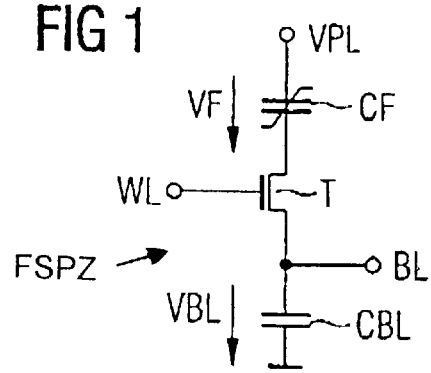
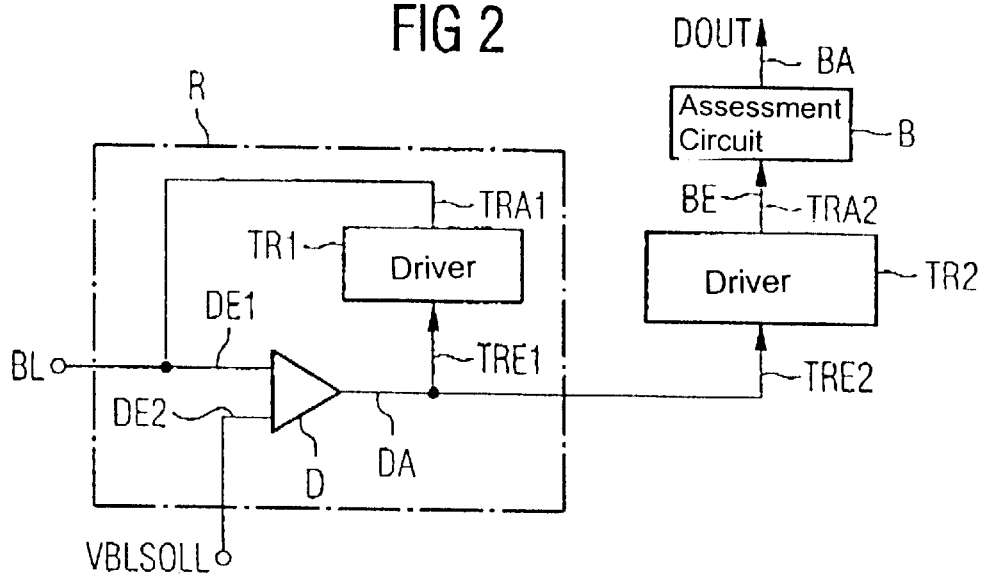
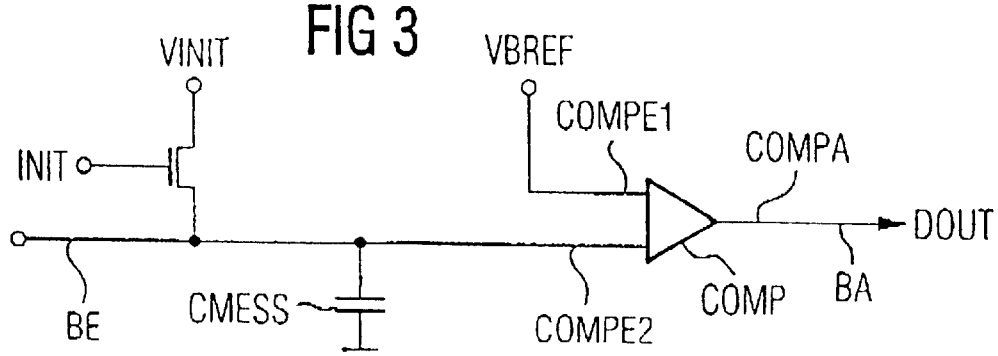

CIRCUIT CONFIGURATION FOR READING A MEMORY CELL HAVING A FERROELECTRIC CAPACITOR

BACKGROUND OF THE INVENTION

Field of the invention

The present invention relates to a circuit configuration for reading a memory cell, which has a ferroelectric capacitor.

Memory cells having ferroelectric capacitors are known, for example, from patent specifications U.S. Pat. No. 5,986,919; U.S. Pat. No. 5,969,980; U.S. Pat. No. 5,991,188 and U.S. Pat. No. 6,002,634. A ferroelectric memory cell in this case contains a ferroelectric capacitor and a selection transistor, which are disposed in a similar manner to a conventional capacitor and a selection transistor in a dynamic random access memory (DRAM) cell. U.S. Patent No. 5,999,439 is a patent specification that deals specifically with a sense amplifier for ferroelectric memory cells. There, a flip-flop with two inputs is connected to two adjacent bit lines, as a sense amplifier.

Normally, ferroelectric memory cells are constructed such that one electrode of the ferroelectric capacitor is connected to a voltage source, and the other electrode is connected to the selection transistor. The gate of the selection transistor is connected to a word line, and its source-drain region, which faces away from the ferroelectric capacitor, is connected to a bit line.

Information is stored in a ferroelectric memory in the polarization of the ferroelectric material. In this case, the "remanence" of the ferroelectric capacitor represents the stored information.

In order to read the ferroelectric memory cell, the selection transistor is opened by a suitable gate voltage, so that the ferroelectric capacitor is connected with a low impedance to the bit line. A voltage of the voltage source applied to the ferroelectric capacitor is then varied so that a read signal is produced on the bit line. By virtue of its geometrical configuration in the ferroelectric memory, the bit line has a bit line capacitance which, together with the ferroelectric capacitor, forms a capacitive voltage divider, and thus splits the available voltage into a voltage which is dropped across the bit line, and a voltage which is dropped across the ferroelectric capacitor.

The voltage which is dropped across the bit line capacitance should be as high as possible since a downstream sense amplifier then receives a large input signal, and the status of the ferroelectric memory cell can be assessed reliably.

In fact, the greater the voltage dropped across the bit line capacitance, the less is the voltage dropped across the ferroelectric capacitor. This becomes a problem if the voltage dropped across the ferroelectric capacitor no longer reaches the coercive voltage. In this situation, it is no longer possible to distinguish clearly between the upper and lower hysteresis curve of the ferroelectric since the opposite charge level or the "repolarization" of the ferroelectric capacitor is no longer reached completely, and is thus below the threshold value for the downstream sense amplifier.

These two contradictory configuration conditions for the capacitance of the ferroelectric capacitor and the capacitance of the bit line limit the configuration freedom and feasibility of ferroelectric memories and memory arrays to a very major extent.

It follows from the two contradictory conditions that there is an optimum value for the ratio of the bit line capacitance to the capacitance of the ferroelectric capacitor. If this results in a very high bit line capacitance for a given capacitance of the ferroelectric capacitor, then the bit line will be very long, which leads to a long bit line time constant. This slows down the read rate of the ferroelectric memory cell and of the ferroelectric memory to a major extent.

If a given capacitance of the ferroelectric capacitor results in that a very small bit line capacitance should be used, then the bit line must be chosen to be very short, which necessitates a cell array architecture with a very large number of bit lines and sense amplifiers. This leads to a large space requirement for the ferroelectric memory.

In order to achieve optimum area utilization in the ferroelectric memory cell array, it is thus necessary to use a ratio other than the optimum between the bit line capacitance and the capacitance of the ferroelectric capacitor. For the reasons mentioned above, this leads to a reduction in the read signal on the bit line.

SUMMARY OF THE INVENTION

It is accordingly an object of the invention to provide a circuit configuration for reading a memory cell having a ferroelectric capacitor which overcomes the above-mentioned disadvantages of the prior art devices of this general type, in which a ratio of the bit line capacitance to the capacitance of the ferroelectric capacitor can be selected within a wider range.

With the foregoing and other objects in view there is provided, in accordance with the invention, a circuit configuration for reading circuits. The circuit configuration contains a memory cell having a ferroelectric capacitor, a bit line connected to the memory cell, and a differential amplifier having a first differential amplifier input, a second differential amplifier input and a differential amplifier output. The first differential amplifier input is inverting and the second differential amplifier input is non-inverting, the first differential amplifier input is connected to the bit line, and the second differential amplifier input is connected to a reference signal. A driver circuit having a driver input connected to the differential amplifier output and a driver output connected to the bit line for regulating a potential on the bit line at a potential of the reference signal is provided.

The achievement of the object according to the invention introduces a new assessment principle for ferroelectric memories. One idea in this case is for the voltage on the bit line when reading the ferroelectric memory cell to be regulated by a control loop to the value of a reference signal. Thus, when the ferroelectric memory cell is being read, the voltage on the bit line remains approximately constant, except for any control error. The voltage of the voltage source connected to the ferroelectric capacitor is varied. In consequence, the voltage dropped across the ferroelectric capacitor is governed essentially by the voltage of the voltage source, and is independent of the ratio of the bit line capacitance to the capacitance of the ferroelectric capacitor. The first driver circuit is used to close the control loop and to provide the feedback from the differential amplifier output to the first differential amplifier input. Since, in ferroelectric memories and ferroelectric capacitors, the amount of charge which is required to repolarize the ferroelectric capacitor represents the magnitude to be measured, the first driver circuit is preferably configured such that it provides an appropriate amount of charge at the first driver output as a function of the input signal at the first driver input to the ferroelectric capacitor, and thus keeps the voltage on the bit line substantially constant.

It is also possible to provide for a second driver circuit, having a second driver input and a second driver output, to be disposed, and for the differential amplifier output to be connected to the second driver input. The second driver circuit operates, for example, in an equivalent manner to the first driver circuit. However, it is used to supply charge to a circuit configuration downstream from it. The second driver circuit advantageously makes it possible to supply a downstream circuit with an amount of charge that is equal to, proportional to or is equivalent to that of the ferroelectric capacitor.

A further refinement of the invention contains the provision of an assessment circuit with an assessment input and an assessment output, and the assessment input being connected to the second driver output. The object of the assessment circuit downstream from the second driver circuit is to assess the charge signal supplied from the second driver circuit and transform it to a suitable form for downstream circuit elements, for example in the form of CMOS-compatible voltage levels.

According to a further embodiment of the invention, the bit line together with the differential amplifier and the first driver circuit are regulated to the voltage of the reference signal. Since the bit line is regulated to the value of the reference signal, the voltage on the bit line remains approximately constant. This advantageously results in that the bit line charge level need not be changed to a different voltage level, meaning that the ferroelectric memory configuration can be read quickly. It is also advantageous that the voltage dropped across the ferroelectric capacitor is governed essentially by the voltage source. In consequence, the voltage dropped across the ferroelectric capacitor is dependent neither on the bit line capacitance nor on the polarization of the ferroelectric in the ferroelectric capacitor.

One development of the invention provides for the ferroelectric memory cell to have a ferroelectric capacitor and a selection transistor with a gate connection, with a first connection of the ferroelectric capacitor connected to a voltage source, a second connection of the ferroelectric capacitor connected to a source region of the selection transistor, and the bit line connected to a drain region of the selection transistor. The described ferroelectric memory cell is particularly suitable for being read using the circuit configuration according to the invention. The described ferroelectric memory cell is compact, and contains only two components.

The configuration according to the invention furthermore provides for the assessment device to have a comparator with a first comparator input and a second comparator input. The first comparator input is connected to a reference signal, and the second comparator input is connected to a measurement capacitor and to the second driver output. The object of the measurement capacitor is to add up the amount of charge supplied from the second driver circuit and to be charged to an appropriate level, which is equivalent to the polarization of the ferroelectric memory cells. The voltage change produced by the amount of charge that is supplied from the second driver circuit can be varied by the magnitude of the measurement capacitor.

The downstream comparator compares the voltage dropped across the measurement capacitor with a reference voltage and, at its output, produces a voltage which corresponds to a logic "1" or to a logic "0". The reference voltage is chosen such that the voltage dropped across the measurement capacitor for a ferroelectric capacitor which has not been repolarized and for a ferroelectric capacitor which has been repolarized is respectively less than and greater than the reference voltage.

The circuit configuration according to the invention for reading a ferroelectric memory cell separates the step of reading the cell information and the step of assessment of the cell information. These two tasks can thus be optimized independently of one another.

Other features which are considered as characteristic for the invention are set forth in the appended claims.

Although the invention is illustrated and described herein as embodied in a circuit configuration for reading a memory cell having a ferroelectric capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a ferroelectric memory cell according to the invention;

FIG. 2 is a block diagram of a circuit configuration according to the invention for reading the memory cell having a ferroelectric capacitor; and FIG. 3 is a circuit diagram of the configuration of an assessment circuit according to the invention.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a ferroelectric memory cell FSPZ having a ferroelectric capacitor CF. The ferroelectric capacitor CF is connected to a voltage source VPL and to a selection transistor T, which is controlled via a gate connection WL and, for its part, is connected to a bit line BL. Owing to the geometric configurations of the bit line BL, the bit line BL has a parasitic bit line capacitance CBL. When the transistor T is switched on, a voltage is applied, using the voltage source VPL, to the ferroelectric memory cell FSPZ so that a voltage VF is dropped across the ferroelectric capacitor CF, and a voltage VBL is dropped across the bit line capacitance CBL. The configuration containing the ferroelectric capacitor CF and the bit line capacitance CBL acts as a capacitance voltage divider. In order to read the ferroelectric memory cell FSPZ, the selection transistor T is normally switched on by applying a suitable voltage to its gate connection WL, so that the ferroelectric capacitor CF is connected with a low impedance to the bit line BL. Normally, the voltage of the voltage source VPL is then varied, and a read signal is produced on the bit line BL.

FIG. 2 shows a circuit configuration according to the invention for reading the ferroelectric memory cell. The circuit configuration includes a differential amplifier D, which has a first differential amplifier input DE1 and a second differential amplifier input DE2. The first differential amplifier input DE1 is, for example, an inverting input, and the second differential amplifier input DE2 is, for example, a non-inverting input. The second differential amplifier input DE2 is connected to a reference signal VBLSOLL, and the first differential amplifier input DE1 is connected to the bit line BL. Normally, a differential amplifier has one positive and one negative input. In this exemplary embodiment, the second differential amplifier input DE2 is the positive input, and the first differential amplifier input DE1 is the negative input.

Furthermore a first driver circuit TR1 having a first driver output TRA1 and a first driver input TRE1 is disposed such that the differential amplifier output DA is connected to the first driver input TRE1, and the first driver output TRA1 is connected to the bit line BL. In consequence, the described configuration corresponds to a differential amplifier with feedback. The feedback circuit is enclosed by a dashed line and is referred to as a control loop R. In this exemplary embodiment, the first driver circuit TR1 is used to supply the bit line BL with an amount of charge which is governed by the signal at the differential amplifier output DA. This charge is used to regulate the bit line voltage VBL at the reference value of the reference signal VBLSOLL.

Furthermore, a second driver circuit TR2 having a second driver input TRE2 and a second driver output TRA2 is disposed such that the differential amplifier output DA is connected to the second driver input TRE2.

An assessment circuit B, which has an input BE and an output BA, is disposed such that the second driver output TRA2 is connected to the assessment input BE. The object of the second driver circuit TR2 in this case is to supply the assessment circuit B with an amount of charge which is equivalent to the amount of charge supplied to the bit line BL via the first driver circuit TR1. The circuit configuration results in that the assessment circuit B is supplied with an amount of charge which is equal to, proportional to or equivalent to the amount of charge which was used, via the bit line BL, to read the ferroelectric capacitor CF of the ferroelectric memory cell FSPZ. The assessment output BA is in this case used as a data output DOUT from the circuit configuration according to the invention.

FIG. 3 shows a further refinement of the assessment circuit B according to the invention. The assessment circuit B contains a comparator COMP having a first comparator input COMPE1, a second comparator input COMPE2 and a comparator output COMPA. The first comparator input COMPE1 is connected to a reference voltage VBREF. The second comparator input COMPE2 is connected to the assessment input BE and to a measurement capacitor CMESS. That electrode of the measurement capacitor CMESS which faces away from the second comparator input COMPE2 is connected to a reference ground potential. The comparator output COMPA is connected to the output BA of the assessment circuit B, and thus to the data output DOUT. The measurement capacitor CMESS is used to add up the amount of charge that is supplied via the assessment input BE to the assessment circuit B. In the process, the measurement capacitor CMESS is charged to a corresponding voltage level. The voltage level dropped across the measurement capacitor CMESS is compared with the reference voltage VBREF by the comparator COMP, and an appropriate output signal DOUT is produced. A transistor which is connected to the assessment input BE and to an initialization voltage source VINIT, and which is controlled via an initialization signal INIT, is used to ensure that the assessment circuit B is in a defined state at the start of an assessment process.

We claim:

1. A circuit configuration for reading circuits, comprising:

a memory cell having a ferroelectric capacitor;

a bit line connected to said memory cell;

a differential amplifier having a first differential amplifier input, a second differential amplifier input and a differential amplifier output, said first differential amplifier input being inverting and said second differential amplifier input being non-inverting, said first differential amplifier input connected to said bit line, and said second differential amplifier input connected to a reference signal; and a driver circuit having a driver input connected to said differential amplifier output and a driver output connected to said bit line for regulating a potential on said bit line at a potential of the reference signal, said potential on said bit line being regulated to said potential of the reference signal when reading the memory cell.

2. The configuration according to claim 1, including a further driver circuit having a further driver input connected to said differential amplifier output and a further driver output.

3. The configuration according to claim 2, including an assessment circuit having an assessment input connected to said further driver output and an assessment output.

4. The configuration according to claim 1, wherein said bit line together with said differential amplifier and said driver circuit are regulated at the potential of the reference signal.

5. The configuration according to claim 1, wherein said memory cell has a selection transistor with a gate connection, a source region and a drain region, said ferroelectric capacitor has a first connection to be connected to a voltage source and a second connection connected to said source region of said selection transistor, and said bit line connected to said drain region of said selection transistor.

6. The configuration according to claim 3, wherein said assessment circuit has a measurement capacitor and a comparator with a first comparator input and a second comparator input, said first comparator input to be connected to a further reference voltage, and said second comparator input connected to said measurement capacitor and to said further driver output.

* * * * *